(12) United States Patent
Park et al.

(10) Patent No.: US 7,540,743 B2
(45) Date of Patent: Jun. 2, 2009

(54) MEMORY MODULE, MEMORY MODULE SOCKET AND MAINBOARD USING SAME

(75) Inventors: Sung-Joo Park, Anyang-si (KR); Kyoung-Sun Kim, Uijeongbu-si (KR); Jung-Joon Lee, Gangnam-gu (KR); Jea-Eun Lee, Gangseo-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/836,286

(22) Filed: Aug. 9, 2007

(65) Prior Publication Data

US 2008/0038961 A1 Feb. 14, 2008

(30) Foreign Application Priority Data

Aug. 11, 2006 (KR) .................. 10-2006-0076261

(51) Int. Cl.
*H01R 12/00* (2006.01)
(52) U.S. Cl. .................................... 439/65
(58) Field of Classification Search .............. 439/59, 439/61, 62, 65, 680
See application file for complete search history.

(56) References Cited

U.S. PATENT DOCUMENTS

| | | | |
|---|---|---|---|
| 4,023,878 A * | 5/1977 | Hennessey | 439/65 |
| 6,347,039 B1 | 2/2002 | Lee | |
| 6,585,525 B2 * | 7/2003 | Jung et al. | 439/55 |
| 6,695,650 B2 * | 2/2004 | Mueller | 439/680 |
| 6,767,258 B2 * | 7/2004 | Chien | 439/680 |
| 7,186,150 B1 * | 3/2007 | Boone | 439/680 |
| 2004/0264269 A1 | 12/2004 | Cho et al. | |
| 2006/0009048 A1 * | 1/2006 | Hsieh | 439/65 |

FOREIGN PATENT DOCUMENTS

| | | |
|---|---|---|
| JP | 2000164272 | 6/2000 |
| KR | 1020000018572 A | 4/2000 |
| KR | 1020040058417 A | 7/2004 |

\* cited by examiner

*Primary Examiner*—Tho D Ta
(74) *Attorney, Agent, or Firm*—Volentine & Whitt, PLLC

(57) ABSTRACT

A memory module socket disposed on a principal surface of a mainboard, and adapted to mechanically receive and electrically connect a memory module with a mainboard, the memory module socket including a first unit socket having a plurality of first socket pins adapted to electrically connect a first connector disposed on an edge of the memory module, and a second unit socket having a plurality of second socket pins adapted to electrically connect to a second connector disposed on the memory module orthogonal to the first connector, wherein the memory module as installed in the memory module socket is parallel to the principal surface of the mainboard.

10 Claims, 9 Drawing Sheets

MEMORY MODULE, MEMORY MODULE SOCKET AND MAINBOARD USING SAME

This application claims the benefit of Korean Patent Application No. 10-2006-0076261, filed on 11 Aug. 2006, the subject matter of which is hereby incorporated by reference.

BACKGROUND OF THE INVENTION

1. Field of the Invention

The present invention relates to a memory module, a memory module socket, and a mainboard using same. More particularly, the invention relates to a memory module providing an increased number of connectors adapted for use as external connection ports to the memory module, a related memory module socket, and a mainboard incorporating same.

2. Description of the Related Art

Contemporary computational systems, such as personal computers (PCs), workstations, notebook computers, and mobile devices such as mobile phones require an increasing variety of functional capabilities. This expanding set of capabilities requires a greater tolerance for different software configurations and hardware add-ons. At the same time, contemporary computational systems are being reduced in physical size while also providing greater data capacities and increased operating speeds.

One result of these commercial motivations is the provision of significantly expanded memory capabilities within contemporary computational systems. The number, speed and complexity of signals (e.g., data, address and control) applied to the various memory resources in such systems have also increased. The number of connection pins (ground, power and signal) connecting this expanding multiplicity of signals is also increasing. This increasing number of memory module pins generally increases the area (and/or number deposition layers) associated with memory modules incorporated within the system. The overall wiring design of the printed circuit boards (PCBs) implementing the various memory modules as well as the incorporating mainboard has been in many instances quite challenging. As a result of this difficulty, further reductions in the physical size of contemporary computational systems has been impeded and the signaling performance associated with constituent memory systems has in some instance deteriorated.

Memory modules are devices mounting a plurality of semiconductor memory devices on a single substrate, such as a PCB. Memory modules commonly group the performance functionality of the memory devices, such as the provision of power/ground signals, control and address signals, etc. Memory modules are commonly connected to one another or to a mainboard using via socket and pin assemblies. That is, a memory module is mechanically inserted into a memory module socket to electrically connect it with the mainboard (sometimes referred to as a motherboard) within a computational system.

Common memory modules include the single in-line memory module (SIMM) type in which contact points are linearly arranged on one side of the module substrate, and the dual in-line memory module (DIMM) type in which the contact points are linearly arranged on both sides of the memory module substrate. Indeed, most memory modules have a structure in which the contact points are arranged along one or more primary sides in a lengthwise direction.

However, when a connector, (such as a Tape Automated Bonded or TAB connector), is formed on a memory module such that its contact points are arranged along only one side, it is difficult to meet the contemporary demands for a greater number of connections. This is particularly true given the decreasing size of many memory modules. Thus, further reductions in the size of memory modules is precluded by a lack of reliable electrical connections.

To begin addressing this problem, another type of memory module has recently been introduced. This memory module includes not only a number of external connection ports formed along the lengthwise direction of module substrate, but also along the widthwise direction (i.e., along the short sides of the memory module).

Figure (FIG.) 1 is a front schematic view of a conventional memory module as it fits into a corresponding memory module socket. Referring to FIG. 1, a total three connectors, including a lengthwise connector 111 and two widthwise connectors 112, are formed on a memory module 110 mounting a plurality of memory devices 115. A memory module socket 120 mounted on a mainboard substrate 150 is adapted to receive memory module 110 and has a U-shaped structure containing socket pins that correspond to connectors 111 and 112.

When edge portions of memory module 110 are inserted into memory module socket 120 from a direction indicated by an arrow in FIG. 1, the pins forming connectors 111 and 112 are electrically connected to the socket pins of memory module socket 120. Thus, memory module 110 is mechanically and electrically connected to mainboard 150 via memory module socket 120. Through this multiplicity of pin connections power, data, control and address signals may be communicated between mainboard 150 and memory module 110.

In the conventional example shown in FIG. 1, the pins forming first connector 111 and second connectors 112 must be mechanically inserted into the socket pins of memory module socket 120. However, this insertion-connection approach presents some structural difficulties. That is, considering the direction at which memory module 110 is inserted into memory module socket 120 and the edge-perpendicular layout of the individual pins forming first connector 111 and second connectors 112, the sheering mechanical force exerted on the pins of second connectors 112 may actually damage the constituent pins.

Ideally, the layout of the pins forming second connectors 120 and/or the socket pins in memory module socket 120 would be re-arranged to avoid this mechanical wear and tear. However, the structure of memory module socket 120 is restricted due to its electrical and physical characteristics and a less wearing mechanical arrangement has not been practically realized. For example, it is difficult to shorten the length of a wiring connection associated with second connectors 112 without the connection to memory module socket 120 becoming electrically unstable.

Many DIMM type memory modules designed for portable use within mobile devices and notebook computers have adopted the so-called small outline dual in-line memory module (SODIMM) layout. The connection approach between SODIMMs and corresponding memory module sockets is different from that of general DIMMs. The SODIMM is inserted in its memory module socket by first being inclined at a predetermined angle with respect to the mainboard substrate and then pivoted toward the mainboard parallel with the surface of the mainboard substrate in order to be coupled within the memory module socket. This increased insertion and layout complexity preclude conventional SODIMMs from having widthwise connectors in addition to lengthwise connectors.

A growing demand exists for a practical connection approach for SODIMMs having expanded connection capabilities.

SUMMARY OF THE INVENTION

Embodiments of the invention provide a memory module having an increased number of connectors without expanding the overall area of the memory module, while simultaneously providing a structure that is simple, easy to realize, and capable of being securely and reliably installed in a corresponding memory module socket. Embodiments of the invention also provide corresponding memory module sockets and mainboard assemblies.

In one embodiment, the invention provides a memory module socket disposed on a principal surface of a mainboard, and adapted to mechanically receive and electrically connect a memory module with a mainboard, the memory module socket comprising; a first unit socket having a plurality of first socket pins adapted to electrically connect a first connector disposed on an edge of the memory module, and a second unit socket having a plurality of second socket pins adapted to electrically connect to a second connector disposed on the memory module orthogonal to the first connector, wherein the memory module as installed in the memory module socket is parallel to the principal surface of the mainboard.

In another embodiment, the invention provides a mainboard adapted to mechanically receive and electrically connect a memory module, and mainboard comprising; a mainboard substrate and a memory module socket mounted on the mainboard substrate. The memory module socket comprises; a first unit socket having a plurality of first socket pins adapted to electrically connect a first connector disposed on an edge of the memory module, and a second unit socket having a plurality of second socket pins adapted to electrically connect to a second connector disposed on the memory module orthogonal to the first connector, wherein the memory module as installed in the memory module socket is parallel to the principal surface of the mainboard.

In another embodiment, the invention provides a memory module comprising; a memory module substrate having a plurality of memory devices mounted thereon, a first connector having a first set of connection pins with in a first arrangement, the first connector being formed on a lengthwise edge of the memory module substrate, and a second connector disposed orthogonal to the first connector and having a second set of connection pins with a second arrangement different from the first arrangement.

DESCRIPTION OF EMBODIMENTS

Figure 1:
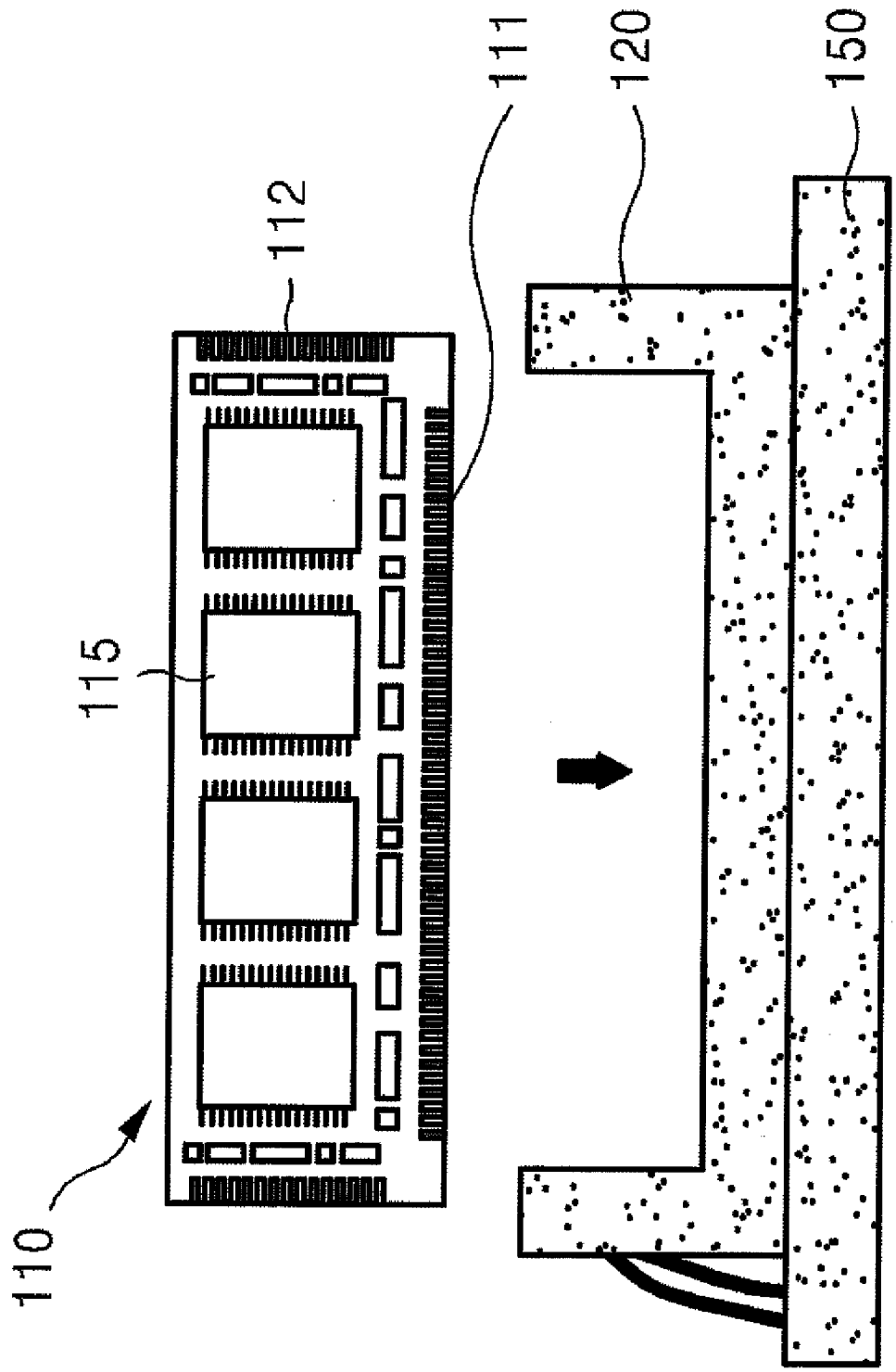
FIG. 1 is a front view showing a state in which a memory module is coupled to a conventional memory module socket.

The invention will now be described in relation to several embodiments illustrated in the attached drawings. Throughout the written description and drawings, like reference numerals will be used to denote like or similar elements.

Figure 2:
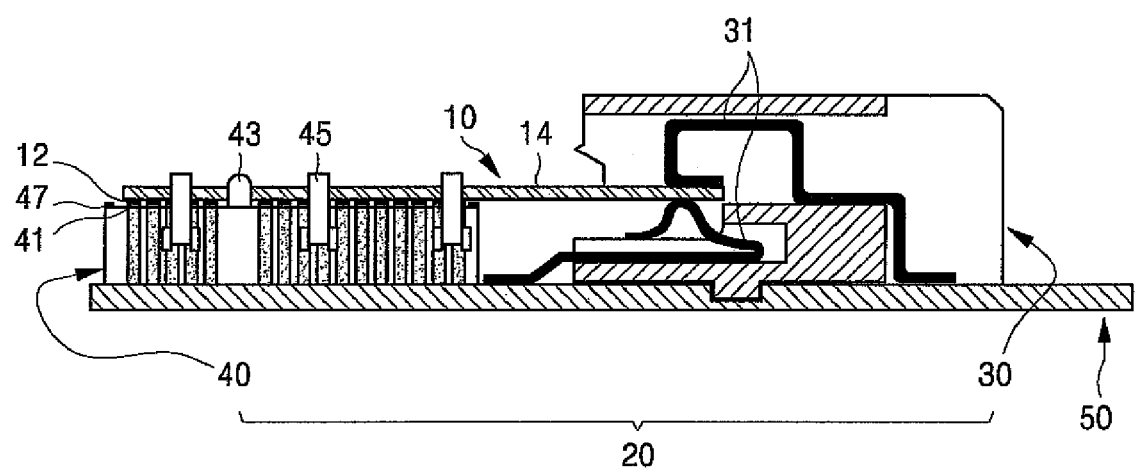
FIG. 2 is a cross sectional view showing a coupling state of a memory module and a memory module socket according to an embodiment of the present invention.
Figure 3:
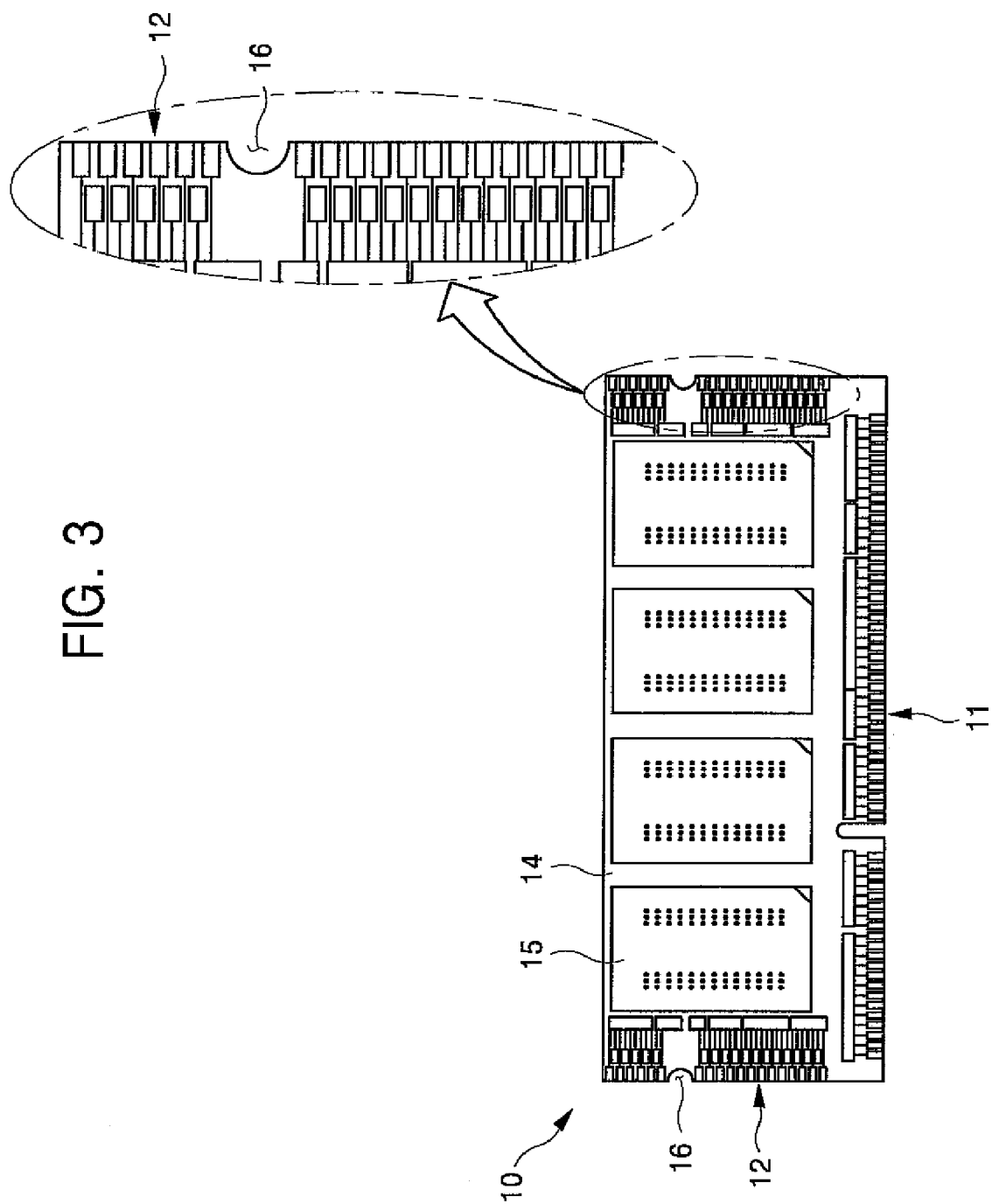
FIG. 3 is a plan view of the memory module of FIG. 2.
Figure 4:
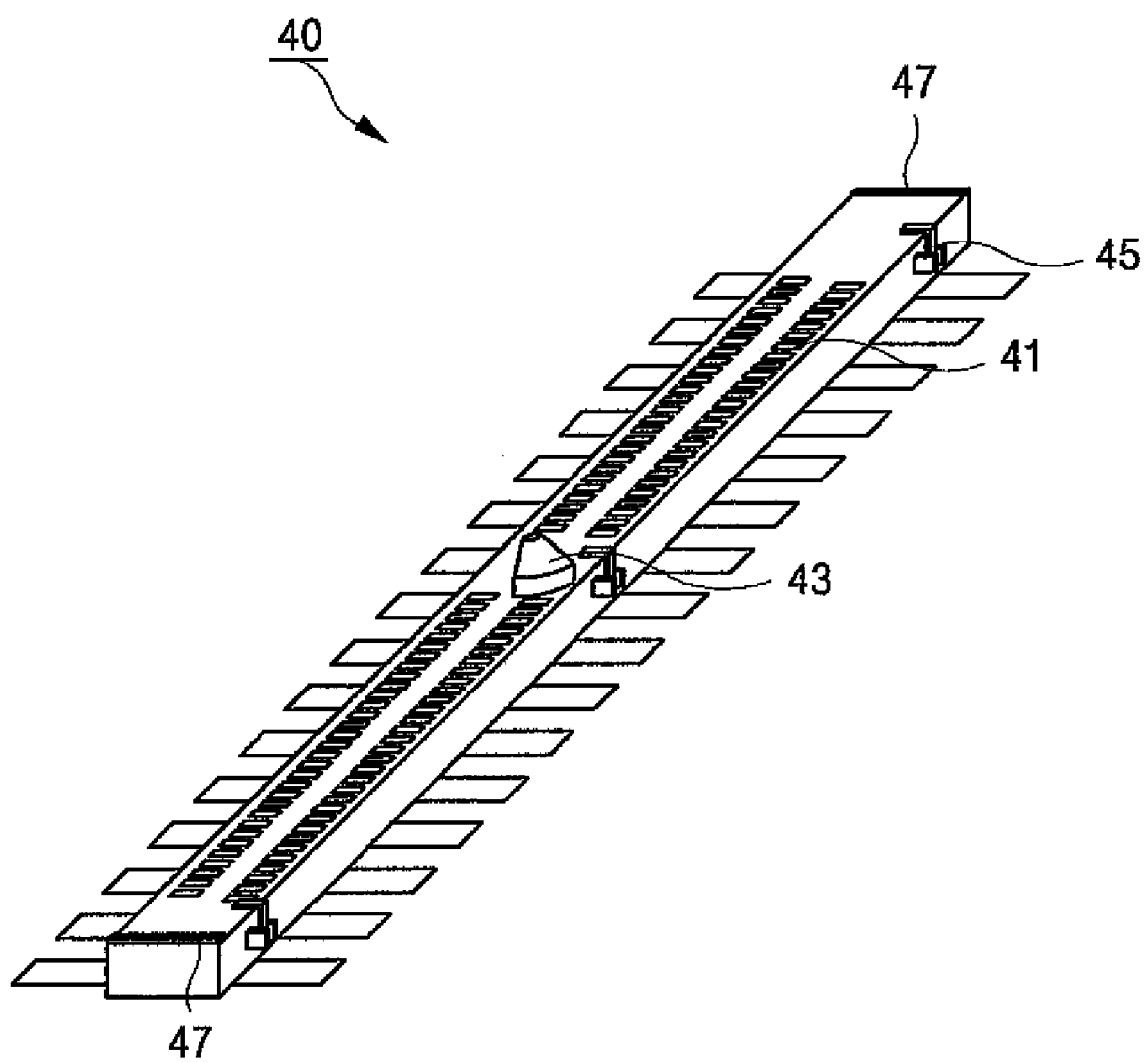
FIG. 4 is a perspective view of a second unit socket of the memory module socket of FIG. 2.
Figure 5:
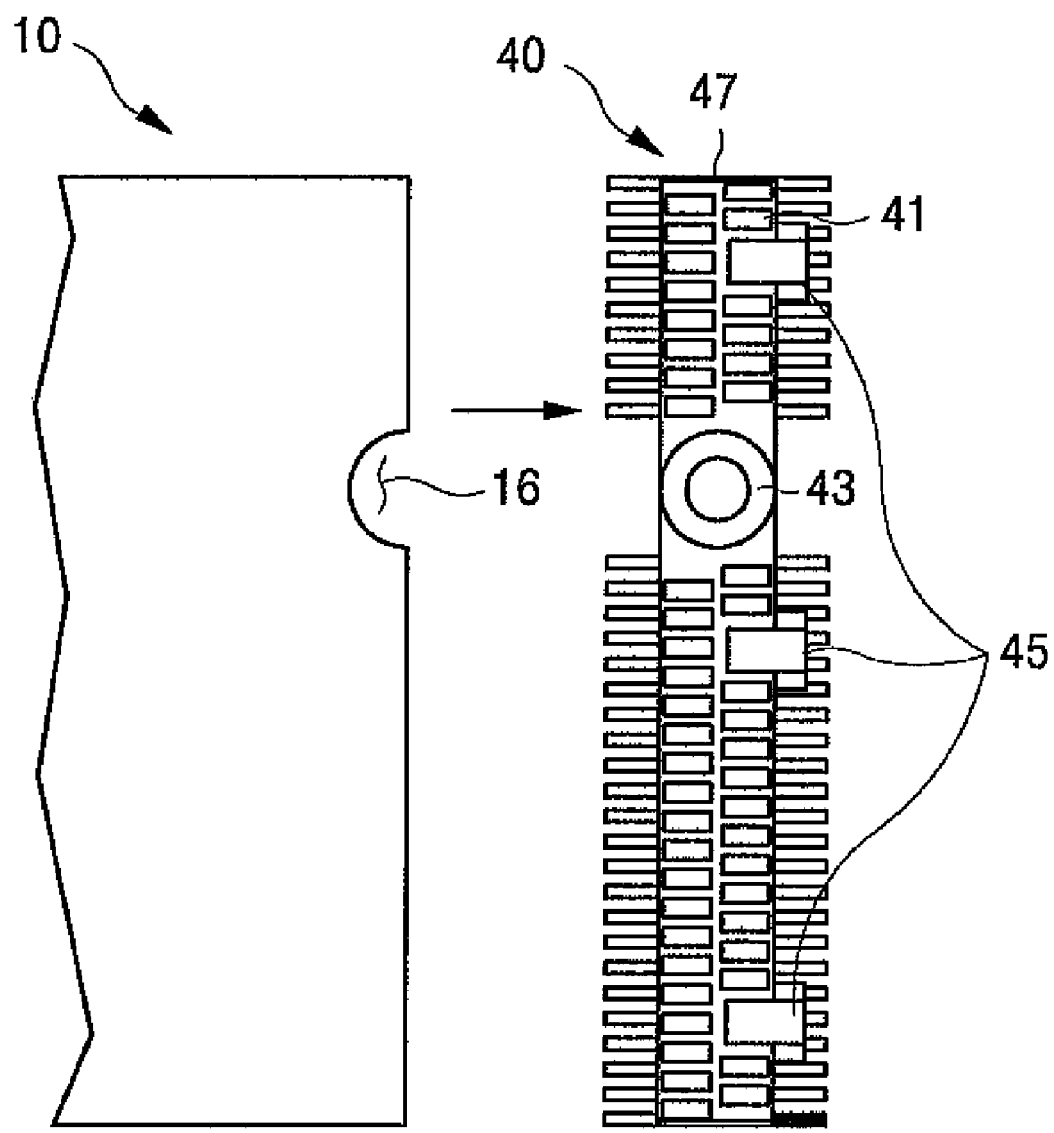
FIG. 5 is a plan view of the memory module of FIG. 3 and the second unit socket of the memory module socket of FIG. 4.
Figure 6:
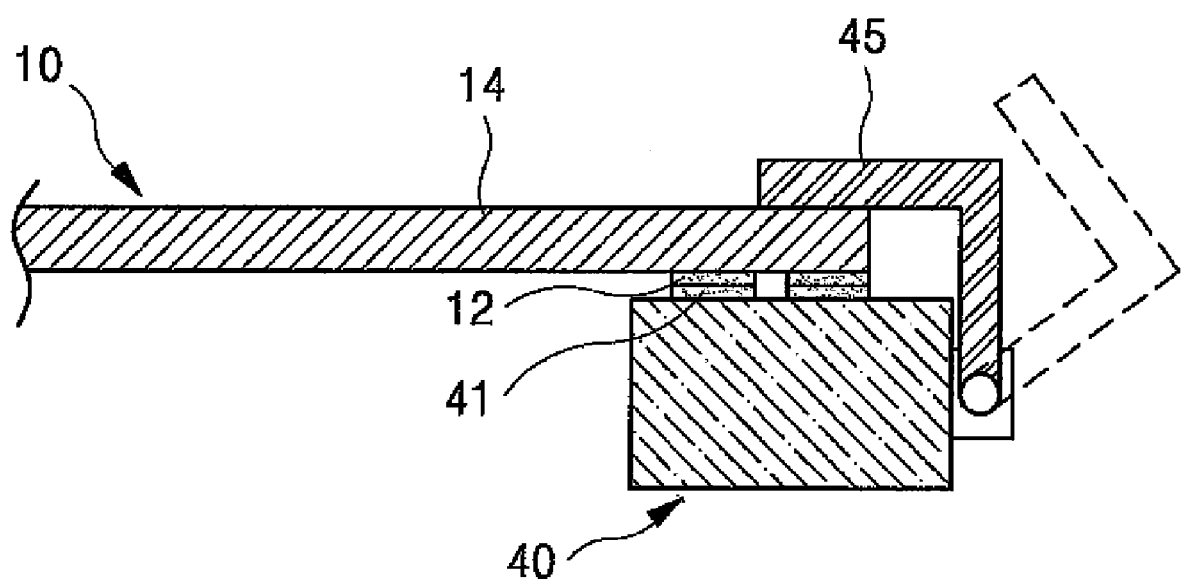
FIG. 6 is a cross sectional view for explaining the operation of a fixing latch of the memory module socket of FIG. 2.
Figure 7:
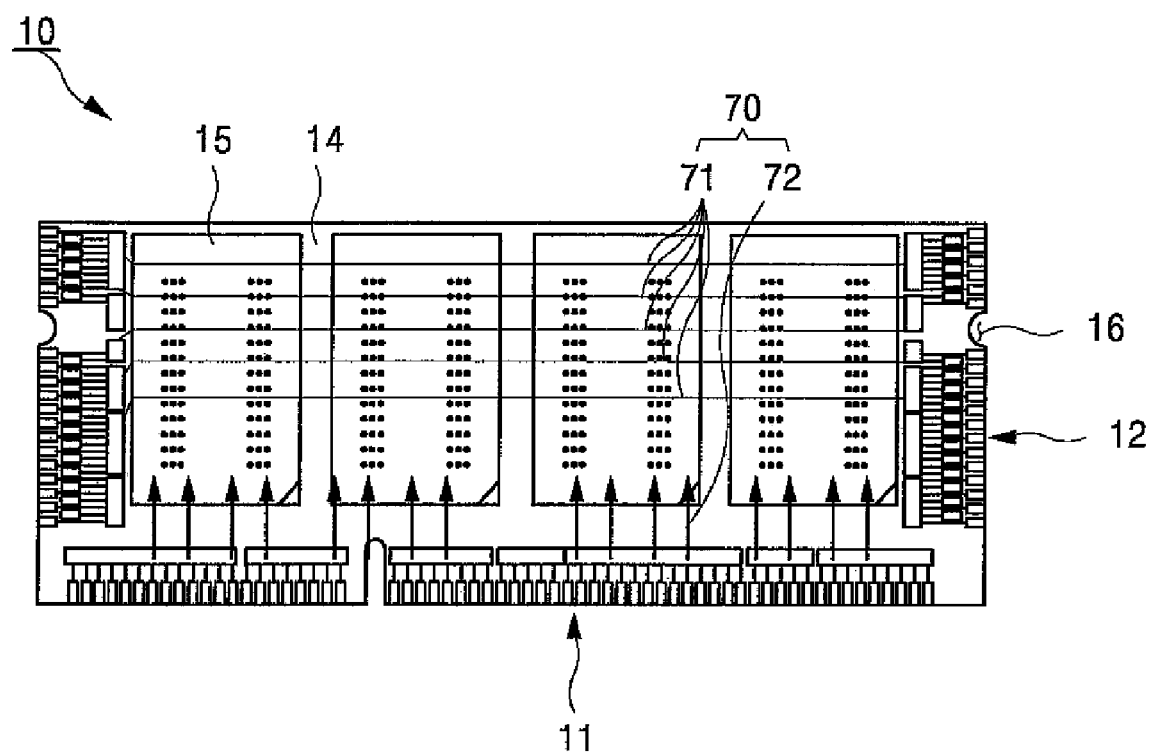
FIG. 7 is a view schematically showing the wiring pattern of the memory module of FIG. 3.

FIG. 2 is a cross sectional view showing a coupled state between a memory module and a memory module socket according to an embodiment of the present invention. FIG. 3 is a plan view of the memory module shown in FIG. 2. FIG. 4 is a perspective view of the second unit socket of the memory module socket shown in FIG. 2. FIG. 5 is a plan view of the memory module shown in FIG. 3 and the second unit socket of the memory module socket shown in FIG. 4. FIG. 6 is a cross sectional view further illustrating the operation of the fixing latch for the memory module socket shown in FIG. 2. FIG. 7 is a schematic view illustrating a wiring pattern for the memory module shown in FIG. 3.

As illustrated in FIGS. 2 through 7, only a mainboard substrate 50 of an assumed mainboard is shown. The multiplicity of components commonly provided on the mainboard are not illustrated to preserve clarity in the drawings. With collective reference to FIGS. 2 through 7, a memory module socket 20 is installed on mainboard substrate 50 and an end portion of a memory module 10 is inserted in memory module socket 20. Memory module 10 is electrically connected to the mainboard via memory module socket 20.

In the illustrated embodiment, memory module 10 is assumed to be a SODIMM, such as the type commonly used in mobile devices such as notebook computers and mobile phones. However, the invention is not limited to only this type of memory module, but may be applied to at least other DIMM types. However, as will be described in greater detail below, an embodiment of the present invention as applied to a SODIMM (e.g., memory module 10) allows an efficient arrangement of the memory module on mainboard substrate 50 with an expanded number of connection ports having greater overall physical reliability.

As shown in greater detail in FIG. 3, memory module 10 comprises a memory module substrate 14 having a wiring pattern 70 formed thereon, a plurality of memory devices 15 mounted on a principal surface of memory module substrate 14, lengthwise connectors 11 and widthwise connectors 12 formed on respective lengthwise and widthwise edges of the principal surface. For convenience of explanation, the lengthwise connector 11 will hereafter be referred to as first connector 11 and the widthwise connectors 12 will be referred to collectively or singularly as second connector 12. The illustrated example of FIG. 2 assumes first and second connectors formed by a Tape Automated Bonding (TAB) process but other manufacturing techniques may be used to form the connectors. Further, the terms lengthwise and widthwise are clearly relative terms drawn to the particular rectangular shape of conventional memory modules. Such relative geometric terms are merely exemplary and embodiments of the invention may include memory module substrates have any reasonable shape and size, hence the generic use of "first" and "second" to distinguish respective connectors having different layouts relative to a corresponding memory module socket and/or a direction of insertion for the constituent memory module with the module socket.

That is, certain embodiments of the invention provide a first connector 11 and a second connector 12 having different connection pin layout structures adapted for connection within memory module socket 20. For example, since first connector 11 will be mechanically inserted into a first unit socket 30 and electrically connected with a plurality of first socket pins formed within first unit socket 30, the plurality of connection pins forming first connector 11 may be linearly arranged in a lengthwise direction on one edge of memory module 10. In contrast, since second connector 12 will be mechanically connected into a second unit socket 40 and electrically connected to a plurality of second socket pins 41 formed with second unit socket 40, the plurality of connection pins forming second connector 12 will have a different arrangement (e.g., in one embodiment a so-called staggered arrangement in which the pins forming the second connector 12 are arranged in a zigzag pattern). If the connection pins forming second connector 12 are arranged with a staggered structure, more pins may be arranged in a given spaced as compared with conventional arrangements. Thus, the number of connection ports provided by memory module 10 may be increased without impairing the physical reliability of the design or expanding the size of the module.

As noted above, memory module 10 is electrically connected to the mainboard via memory module socket 20 installed on mainboard substrate 50. Since memory module 10 includes first connector 11 and second connector 12 having different connection pin arrangements, memory module socket 20 comprises first unit socket 30 and second unit socket 40 respectively provided to receive first connector 11 and second connector 12.

Thus, memory module socket 20 according to the illustrated embodiment comprises first unit socket 30 and second unit socket 40. In various embodiments, one or more second unit sockets 40 may be provided on mainboard substrate 50, each adapted to receive a corresponding second connector 12. Second unit socket 40 is disposed lateral to first unit socket 30 along mainboard substrate 50. With the above structure, an edge portion of memory module substrate 14 may be laterally inserted into first unit socket 30 and then pivoted downward to make an electrical connection with one or more second unit socket(s) 40.

Thus, first unit socket 30, as shown in FIG. 2, is adapted to mechanically receive and electrically connect the edge portion of memory module 10 including first connector 11. First unit socket 30 includes a plurality of first socket pins (not shown) adapted to respectively connect with the pins forming first connector 11. In one embodiment, this one-for-one connection is accomplished by means of a leaf spring mechanism 31 aligning the position of memory module substrate 14 and securely supporting memory module 10 with an elastic spring force.

As illustrated in FIG. 2, leaf spring mechanism 31 is provided to elastically support first connector 11 of memory module 10 from opposing sides when the lengthwise edge of memory module substrate 14 is inserted in first unit socket 30. That is, memory module substrate 14 is inserted in first unit socket 30 at a laterally disposed angle with respect to mainboard substrate 50. Once memory module 10 is inserted, leaf spring mechanism 31 presses memory module substrate 14 downward such that it ultimately lays parallel with the principal surface of mainboard substrate 50. Accordingly, the plurality of pins forming first connector 11 are respectively connected with the first socket pins of first unit socket 30 by the elastic force provided by leaf spring mechanism 31. Once memory module 10 has been brought into this position, second connector 12 is ready for insertion with second unit socket 40.

In one embodiment, two second unit sockets 40, as shown in FIG. 2, are disposed in an orthogonal relationship with first unit socket 30 and each adapted to receive a second connector 12 disposed on a widthwise edge of memory module 10. Each second unit socket 40, as further illustrated in FIG. 4, includes a plurality of second socket pins 41 having a one-for-one correspondence with the pins forming each second connector 12. Each second unit socket 40 also includes a notch protrusion 43 used to properly align and position memory module substrate 14, a plurality of fixing latches 45 capturing an inserted memory module substrate 14, and opposing alignment pins 47 used to check the positioning of memory module substrate 14 once captured onto second unit socket 40.

Unlike the conventional arrangement illustrated in FIG. 1, memory module 10 may be gently pivoted into connection contact with second unit socket(s) 40. The corresponding second connectors 12 are not stressed by the force used to mechanically insert the memory module into its corresponding socket. Further, this arrangement accommodates a second connector 12 having a "complex" connection pin layout, as opposed to the conventional "linear" layout of side-by-side pins. The zigzag pattern shown in blow-up section of FIG. 3 is one example of a complex connection pattern. Such complex connection pin layouts allow an increased number of connection pins per unit width of the memory module. In the illustrated example, the staggered or zigzag connection pin layout can be used to realize a more efficient wiring pattern because the second socket pins 41 are arranged more densely. Yet this greater number of connection pins may be safely seated within a corresponding memory socket without risk of damage.

Notch protrusion 43, as shown in FIGS. 4 and 5, is provided in a central location of second unit socket 40 in correspondence with a notch 16 formed in the widthwise edge portion of memory module substrate 14. Notch 16 in memory module substrate 14 couples with notch protrusion 43 when memory module substrate 14 is captured within second unit socket 40, thereby aligning memory module substrate 14 within second unit socket 40.

Fixing latches 45, as shown in FIG. 4, are provided at intervals along the length of second unit socket 40. As further illustrated in FIG. 6, by pivoting fixing latch 45 following insertion of memory module 10 into second unit socket(s) 40, memory module substrate 14 may be held securely to second unit socket(s) 40 by an elastic force exerted by fixing latch 45 to securely capture memory module 10 at second unit socket(s) 40. In the illustrated embodiment, although three fixing latches are provided any other reasonable number of fixing latches might be used.

Alignment pins 47 are additionally provided in the illustrated embodiment at opposing ends of second unit socket 40. Alignment pins 47 ensure that memory module substrate 14 is properly aligned with second unit socket(s) 40 and may be used to check positioning.

In the foregoing configuration, the alignment of memory module 10 is first provided by matching notch 16 of memory module 10 to notch protrusion 43 of second unit socket 40. Then, the alignment may be improved using alignment pins 47 such that second connector 12 of memory module 10 is electrically connected to second socket pins 41 of memory module socket 20. Once properly positioned, memory module 10 may be held securely in second unit socket(s) 40 by fixing latches 45 to provide enhanced physical stability and operating reliability.

As memory module 10 is coupled to memory module socket 20, power, address, control, and data signals may be communicated from the mainboard to each one of the plurality of memory devices 15 on memory module 10 via memory module socket 20. The potential for noise and signal distortion is reduced as the length of corresponding signal lines is reduced. When a connector is provided on only a single lengthwise edge of a memory module, as is typical with conventional approaches, it is difficult to design a wiring layout having relatively short wiring lengths.

However, in a memory module according to one particular embodiment of the invention, as illustrated for example in FIG. 7, the relative length of wiring may be reduced by connecting power, address, and control signal lines 71 through second connector 12, and connecting data signal lines 72 through first connector 11.

As applied to SODIMMs, certain embodiments of the invention additionally minimize the "dead space" commonly present in relation to connected memory modules. Reduction of this dead space facilitates the design of thinner host device profiles for, e.g., mobile devices and notebook computers.

A memory module according to another embodiment of the present invention will be described with reference to FIG. 8 which is a plan view of the memory module and FIG. 9 which is a plan view of a corresponding second unit socket.

Figure 8:
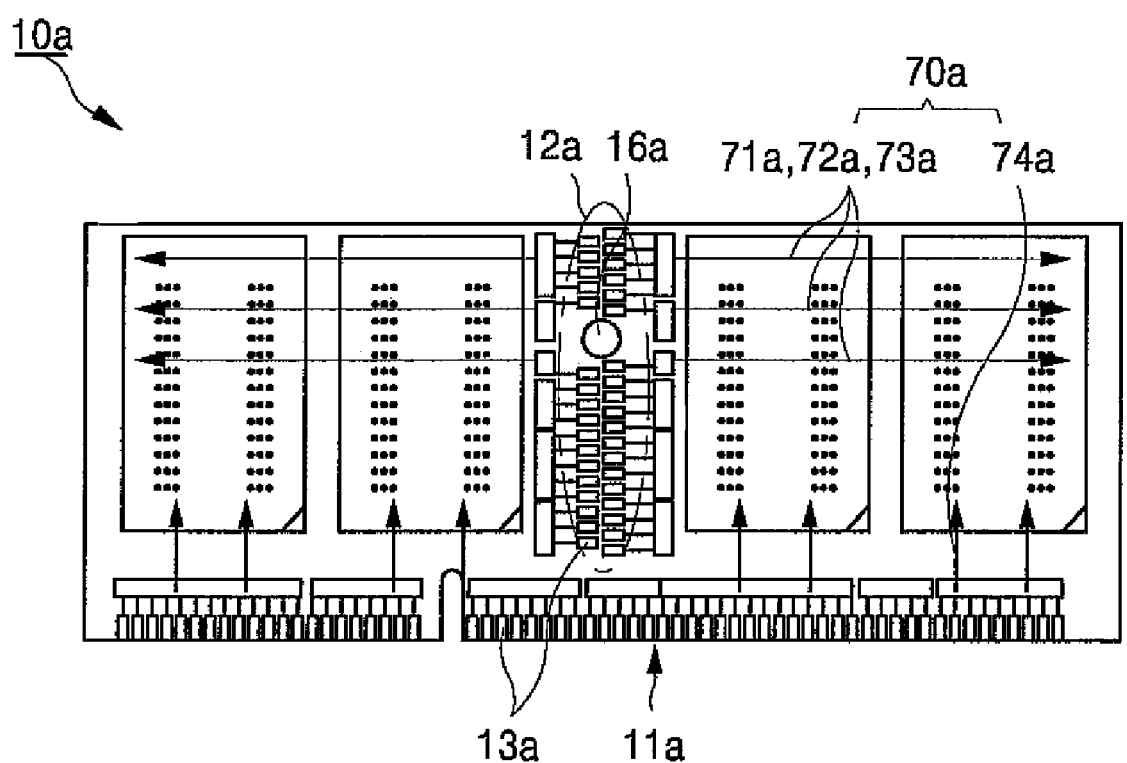
FIG. 8 is a plan view of a memory module according to another embodiment of the present invention.
Figure 9:
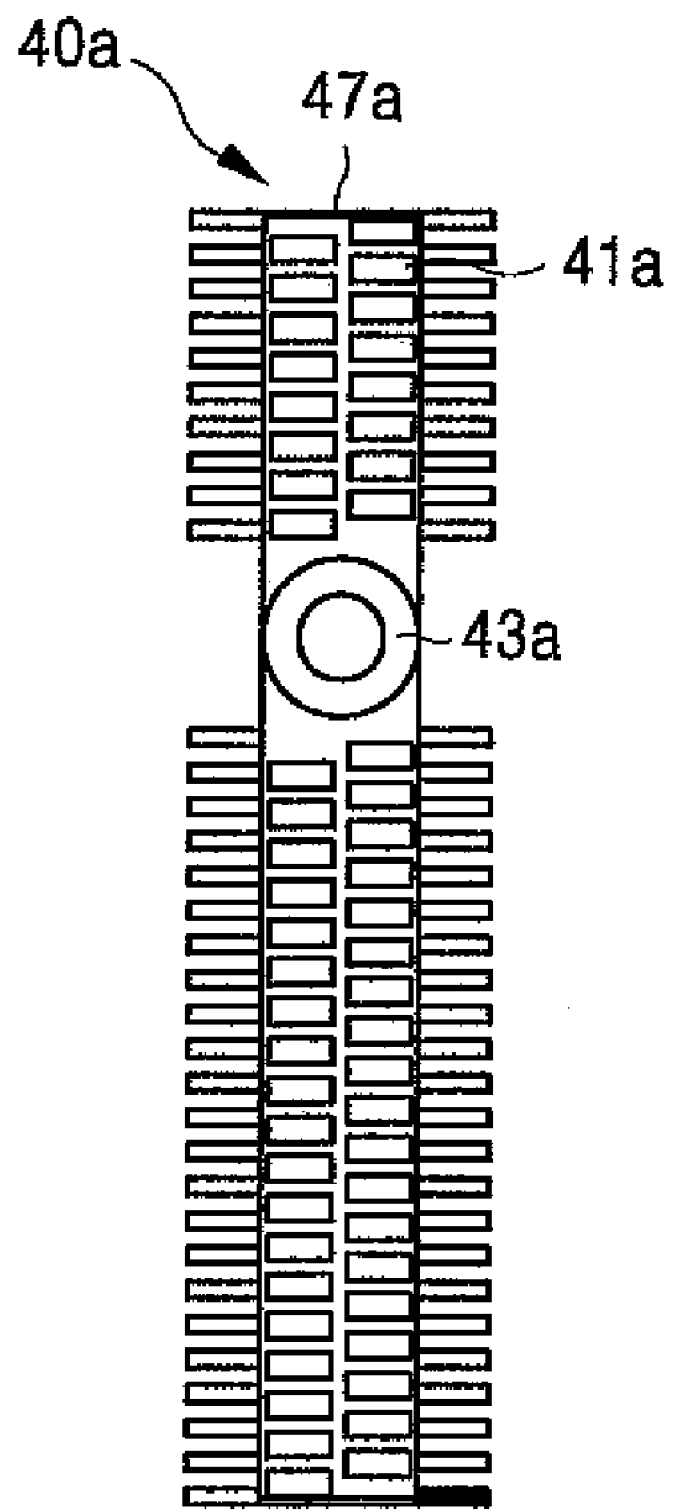
FIG. 9 is a plan view of the second unit socket of a memory module socket according to another embodiment of the present invention that is coupled to the memory module of FIG. 8.

As shown in FIGS. 8 and 9, a memory module 10a according to another embodiment of the present invention has a second connector 12a that is disposed in a central portion of memory module 10a orthogonal to first connector 11a. The pins forming second connector 12a may be arranged in a complex pattern allowing for the inclusion of relatively more pins per unit area. A notch 16a is provided in a central portion of second connector 12a and is adapted to couple with a notch protrusion 43a associated with a second unit socket 40a in order to properly position and align memory module 10a with respect to a corresponding memory module socket (not shown). Thus, memory module 10a may be securely aligned and fixed relative to a memory module socket. Here again, the power, address, and control signal lines 71a may be connected through second connector 10a to the central portion of memory module 10a, while data signal lines 72a are connected through first connector 11a.

In the present embodiment, although the second connector 12a is provided in the central area of the memory module substrate 14a parallel to a short side of the second connector 12a, the right scope of the present invention is not limited thereto. For example, a plurality of memory devices 15a can be arranged lengthy in a direction along the short side. In this case, the second connector 12a can be provided between the memory devices 15a. The second connector 12a of the memory module 10a can be formed on the memory module substrate 14a between the plurality of memory devices 15a because of a particular structure of the second unit socket of the memory module socket according to the present invention.

As shown in additional detail in FIG. 9, a single second unit socket 40a may be provided by the embodiment of the invention illustrated in FIGS. 8 and 9. The second connector 12a of memory module 10a may be similarly connected with second unit socket 40a mounted on a mainboard as described above. That is, a lengthwise edge of memory module 10a containing first connector 11a is first inserted into a corresponding first unit socket (not shown, but similar to the one described above). Then, the memory module substrate 14a is pressed downward to engage second connector 12a with second unit socket 40a. Fixing latches, alignment pins, and notch-to-notch protrusion assemblies may be similarly used to secure memory module 10a within first and second unit sockets. However alternate arrangements are also possible. For example, fixing latches may not be provided in relation to second unit socket 40a, but notch protrusion 43a may be designed to forcibly couple with notch 16a formed on memory module 10a to fix and support memory module substrate 14a.

In the above-described embodiments, terms such as downward, lateral, etc., are used in relation to the illustrated examples. They are clearly relative terms and should not be construed as mandating a particular geometry, layout arrangement of relative position of elements. One or more second connectors may be variously disposed at any reasonable position along a memory module. Various connection pin types and layouts may be used.

While this invention has been particularly shown and described with reference to preferred embodiments thereof, it will be understood by those skilled in the art that various changes in form and details may be made therein without departing from the scope of the invention as defined by the appended claims.

What is claimed is:

1. A memory module socket disposed on a principal surface of a mainboard, and adapted to mechanically receive and electrically connect a memory module with a mainboard, the memory module socket comprising:
   a first unit socket having a plurality of first socket pins adapted to electrically connect a first connector disposed on an edge of the memory module; and
   a second unit socket having a plurality of second socket pins adapted to electrically connect to a second connector disposed on the memory module orthogonal to the first connector,
   wherein the memory module as installed in the memory module socket is parallel to the principal surface of the mainboard,
   the plurality of first socket pins has a linear layout arrangement of side-by-side pins and the plurality of second socket pins has a complex arrangement of pins, and
   the complex arrangement of pins comprises a staggered or zigzag arrangement of pins,
   wherein the first connector of the memory module is laterally inserted into the first unit socket and then the memory module is pivoted to electrically connect the second connector with the second unit socket.

2. The memory module socket of claim 1, wherein the first connector is formed on a lengthwise edge of the memory module and the second connector comprises two second connectors respectively formed on opposing widthwise edges of the memory module.

3. The memory module socket of claim 2, wherein each of the second connectors comprises a notch protrusion adapted to couple with a corresponding notch formed in the memory module.

4. The memory module socket of claim 2, wherein each of the second connectors comprises at least one fixing latch adapted to secure the memory module to the second connector.

5. The memory module socket of claim 2, wherein each of the second connectors comprises at least one alignment pin adapted to align the memory module on the second connector.

6. The memory module socket of claim 1, wherein the first connector is formed on a lengthwise edge of the memory module and the second connector is a single connector centrally disposed in the memory module.

7. The memory module socket of claim 6, wherein the second connector comprises a notch protrusion adapted to forcibly couple with a notch formed in the memory module.

8. A mainboard adapted to mechanically receive and electrically connect a memory module, and mainboard comprising:
- a mainboard substrate; and
- a memory module socket mounted on the mainboard substrate, wherein the memory module socket comprises:
- a first unit socket having a plurality of first socket pins adapted to electrically connect a first connector disposed on an edge of the memory module; and
- a second unit socket having a plurality of second socket pins adapted to electrically connect to a second connector disposed on the memory module orthogonal to the first connector, wherein the memory module as installed in the memory module socket is parallel to the principal surface of the mainboard, the plurality of first socket pins has a linear layout arrangement of side-by-side pins and the plurality of second socket pins has a complex arrangement of pins, and the complex arrangement of pins comprises a staggered or zigzag arrangement of pins, wherein the first connector of the memory module is laterally inserted into the first unit socket and then the memory module is pivoted to electrically connect the second connector with the second unit socket.

9. The mainboard of claim 8, wherein the first connector is formed on a lengthwise edge of the memory module and the second connector comprises two second connectors respectively formed on opposing widthwise edges of the memory module.

10. The mainboard of claim 8, wherein the first connector is formed on a lengthwise edge of the memory module and the second connector is a single connector centrally disposed in the memory module.

* * * * *